United States Patent [19]
Dey et al.

[11] Patent Number: 5,550,749
[45] Date of Patent: Aug. 27, 1996

[54] HIGH LEVEL CIRCUIT DESIGN SYNTHESIS USING TRANSFORMATIONS

[75] Inventors: Sujit Dey; Miodrag Potkonjak, both of Plainsboro, N.J.

[73] Assignee: NEC USA, Inc., Princeton, N.J.

[21] Appl. No.: 254,147

[22] Filed: Jun. 3, 1994

[51] Int. Cl.⁶ .................................................. G06F 17/50
[52] U.S. Cl. ............................................ 364/489; 364/488
[58] Field of Search .................................. 364/488, 489; 371/22.1, 22.3, 22.5, 22.6

[56] References Cited

U.S. PATENT DOCUMENTS 5,359,537  10/1994  Saucier et al. ........................... 364/489
5,359,538  10/1994  Hui et al. ................................. 364/491

OTHER PUBLICATIONS

"PASCANT: A Partial Scan and Test Generation System" by Sudipta Bhawmik et al, IEEE Custom Integrated Circuit Conf., May 12–15, 1991, pp. 17.3.1–17.3.4.

Sujit Dey et al, "Exploiting Hardware Sharing in High-Level Synthesis for Partial Scan Optimization", paper B.1, ICCAD93, Nov. 1993, pp. 20–25.

*Primary Examiner*—Vincent N. Trans
*Attorney, Agent, or Firm*—Philip J. Feig

[57] ABSTRACT

A method of high level circuit design synthesis using transformations based upon the addition of deflection operations reduces the interconnects and register requirements as well as the area requirements of a circuit design while preserving throughput without increasing the number of execution units needed. The method may also be applied to reduce the partial scan overhead for generating testable datapaths. The overall result of the transformations is to improve resource utilization and/or testability of circuits so designed.

10 Claims, 5 Drawing Sheets

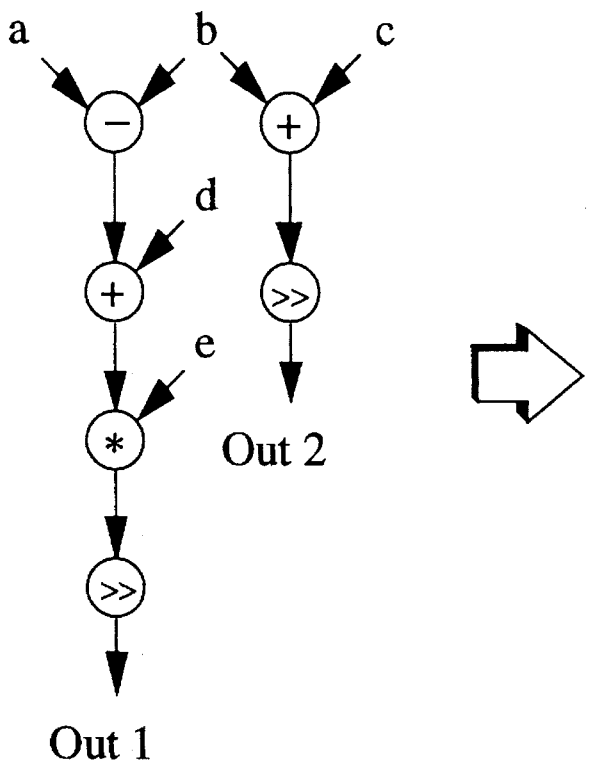
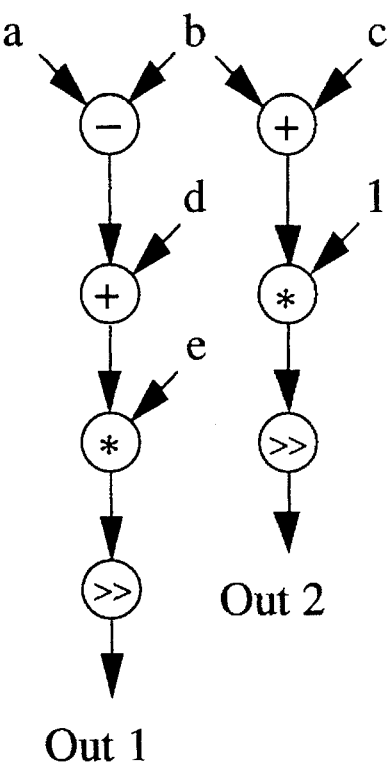
Figure 1(a)  Figure 1(b)
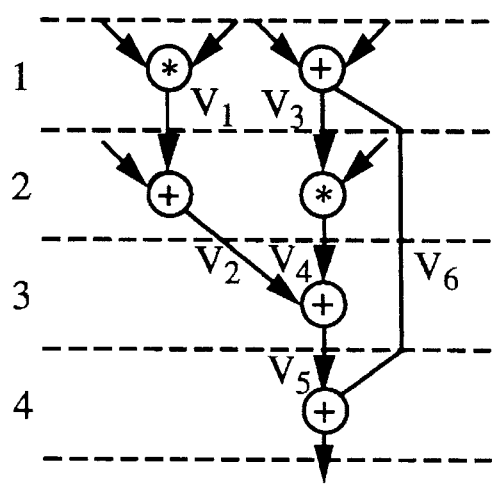
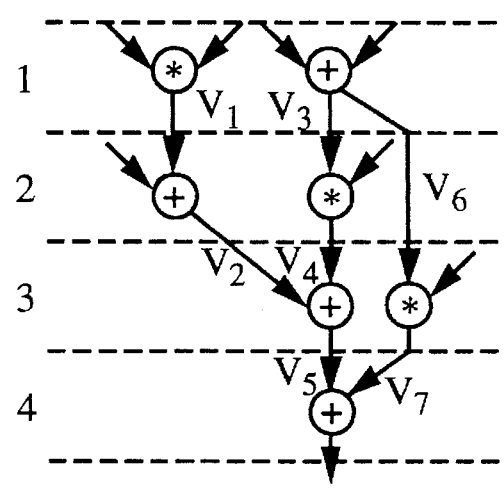
Figure 2(a)  Figure 2(b)

HIGH LEVEL CIRCUIT DESIGN SYNTHESIS USING TRANSFORMATIONS

FIELD OF THE INVENTION

The present invention concerns high level circuit design synthesis using transformation methods which modify the structure of control-data flow graphs while maintaining the functionality of the initial circuit specification. The transformations add deflection operations during high level circuit design synthesis in a manner for reducing registers and interconnects for optimizing resource utilization and reducing area and for minimizing partial scan overhead while making the synthesized design testable.

BACKGROUND OF THE INVENTION

Automatic test generation for sequential circuits is a difficult task. Several different techniques are used to accomplish this task. Complete scan testing, for example, transforms the sequential circuit into a computational circuit by making all the memory elements controllable and observable. However, it may not be possible to design every circuit for complete scan testing and the cost in terms of performance and testing overhead may be prohibitive. Partial scan testing is a more cost-effective alternative in which only a subset of the memory elements are tested thereby reducing delay and area overhead as well as test application time.

Known partial scan methods include those based upon testability measures, test pattern generation or structural analysis. Other methods rely upon heuristics and a cost function to select test memory elements. Some other partial scan methods start with a set of functional vectors to detect as many faults as possible, then combinational test pattern generation is used to find additional memory elements that provide extra controllability and observability to detect the remaining faults. In other methods, memory elements are selected so that the remaining circuit is acyclic.

High level synthesis methods have been used to generate easily testable data paths. The presence of loops in a sequential circuit has been shown to be primarily responsible for making automatic test pattern generation difficult. Accordingly, methods have been devised to synthesize data paths without loops by using proper scheduling and assignment, and scan registers to break loops. In addition to the presence of control data flow graph (CDFG) loops, other types of loops can be introduced in the data path during hardware sharing. In an article by S. Dey, M. Potkonjak, and R. Roy entitled "Exploring Hardware-Sharing in High Level Synthesis for Partial Scan Optimization," paper B.1, ICCAD93, November 1993, there is described a synthesis for testability method that first selects scan variables which can be assigned to scan registers in order to break all the CDFG loops present. Subsequently, scheduling and assignment is performed while attempting to avoid the formation of other types of loops encountered by reusing the selected scan registers.

SUMMARY OF THE INVENTION

The present invention provides a novel method of high level circuit design synthesis using transformations which optimizes speed and area metrics as well as testability. Prior efforts at high level synthesis has been generally focussed on the effects of scheduling and assignment on testability. Transformations have more power to ensure high resource utilization and easily testable datapaths.

Computational transformations are modifications in the structure of control-data flow graph (CDFG) so that the functionality of the initial specification is maintained. These transformations may be applied on different levels of control-data flowgraph (CDFG) hierarchy. More widely used transformations include loop transformations such as loop fusion and fission, loop interchange and software pipelining as well as transformations at operation level (e.g. substitution of multiplication with constants by series of addition and shifts). Basic block transformations are applied on flat graphs (which are either at the lowest level of CDFG hierarchy or flat CDFGs themselves) and consider a number of operations simultaneously.

Transformations have been applied, with success for optimization of various goals, including area, throughput, power and fault tolerance. Many operations used in a computation structure have an identity element associated with them. For instance, an addition operation has an identity element zero, while a multiplication operation has an identity element one. If one of the inputs of an operation is v, and the other input is the identity element of the operation, then the output of the operation remains v. Adding such an operation op between two operations $op_1$ and $op_2$ has the effect of deflecting the result of $op_1$ to op, before $op_2$; hence such an operation is referred to as a deflection operation. A deflection operation can be added anywhere in a computation structure, without changing the functionality of the computation. In particular, adding a deflection operation after a variable v has been computed keeps the behavior invariant because the output of the deflection operation is also v.

A principal object of the present invention is therefore, the provision of a transformation method of adding a deflection operation in circuit design synthesis for improving resource utilization (i.e. reducing cost of design) and reducing circuit area.

A further object of the invention is the provision of a transformation method of adding a deflection operation in design synthesis for reducing the partial scan cost needed to make the resultant design testable.

Another object for the present invention is the provision of adding a deflection operation in design synthesis for partial scan testing for reducing the number of registers and interconnects needed for synthesizing a testable design.

Another object for the present invention is the provision of adding a deflection operation in circuit design synthesis for reducing the number of scanning elements required for synthesizing a testable circuit design.

Further and still other Objects of the present invention will become more clearly apparent when the following description is read in conjunction with the accompanying drawing.

BRIEF DESCRIPTION OF THE DRAWING

FIGS. 1(a) and 1(b) are CDFGs of an example illustrating the concept of adding deflection operations for reducing the interconnect requirements in a circuit;

FIGS. 2(a) and 2(b) are CDFGs of an example illustrating the concept of the addition of a deflection operation for reducing the number of registers in a circuit;

DETAILED DESCRIPTION OF THE INVENTION

In order to better understand the invention, a background into transformation methods will be provided. In describing the present invention, unless otherwise stated, it is assumed that all registers are grouped in a certain quantity of register files (i.e., each register file contains one or more registers) and that each register file sends data to only execution units. At the same time, each execution unit can send data to an arbitrary quantity of register files. Such a model is used in many high level synthesis systems as well as in many manual ASIC and general purpose datapaths. In the following background examples, for the sake of simplicity, it is assumed that all operations take one control step for their execution.

Referring now to the figures and to FIG. 1(a) in particular, there is shown an example of a computation graph (also referred to as a CDFG) which illustrates how a deflection operation can be used to reduce interconnect requirements, while preserving the resource utilization of the other components of the datapath and maintaining the throughput requirements. The following symbols will be used: an addition by +, a subtraction by −, a multiplication by *, a shift by >>, and input and output by IN and OUT. Also A, S, M and SH denote respectively adder, subtracter, multiplier and shifter used in the datapath. The left and right inputs to operations and execution units are denoted by L and R respectively. One unit of each type is sufficient to implement the computation. Finally, the positive and negative input of a subtraction and subtracter are labeled by P and N respectively.

The computation graph in FIG. 1(a) shows a total of 12 edges: IN->P−, IN ->N−, IN->L+, IN->R*, IN->R+, +->L*, *->>>, +->>>, and two instances of both IN->R+ and >>->OUT. At the RT level there are ten corresponding interconnects, since two instances of IN->R+ can share the interconnect SH->OUT.

FIG. 1(b) shows a computation graph functionally isomorphic to the computation from FIG. 1(a), obtained by addition of the deflection multiplication by 1 in the path to Out 2. The computation graph in FIG. 1(b) shows that the new structure has 14 edges. However, only nine interconnects are sufficient at the RT level: IN->PS, IN->NS, IN->RA, IN->LA, IN->RM, S->LA, A->LM, M->SH and SH->OUT, and therefore a better hardware sharing of interconnects is achieved. Note that neither the critical path nor the number of required execution units has been affected by the addition of the deflection operation of multiplication by 1.

Figure 3A:
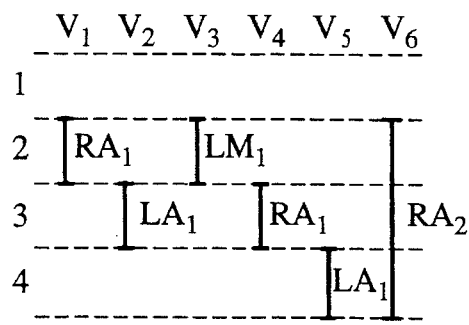
FIGS. 3(a) and 3(b) are timing diagrams of the lifetimes of variables corresponding to the CDFGs in FIGS. 2(a) and 2(b) respectively.
Figure 3B:
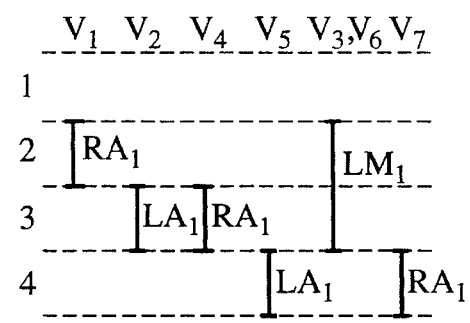

FIGS. 2(a) and 2(b) show two functionally identical computational structures. The structure in FIG. 2(b) is derived from the structure in FIG. 2(a) by adding a deflection operation on the edge V6. The critical path in both structures is identical, 4 control steps. The same number of execution units: one multiplier and one adder are sufficient for both implementations. However, the structure for FIG. 2(b) requires one less interconnect since the interconnect +->R+, is replaced by interconnects which reuse already allocated resources. An analysis of the lifetimes of all intermediate variables (note that all input and output variables in both structures have identical lifetimes) is shown in FIGS. 3(a) and 3(b) respectively. The register assignment is also shown, where LA1, RA1, LM1, RM1 represent the left and right registers of adder A and multiplier M used in the datapath. For the structure in FIG. 2(a), an extra register RA2 is needed, since variable V6 has overlapping lifetime with variables V1 and V4. The introduction of the deflection multiplication operation on edge V6 reduces the lifetime of the variable V7. However, neither the longer lifetime of the variable V3 nor the introduction of the new variable V7 results in the need for a new register, while the reduced lifetime of variable V7 permits variable V7 to share the same register with variable V4.

Several high level synthesis approaches have been proposed exploring the relationship between high level synthesis process and both BIST and ATPG methods have been studied. It is known that the presence of loops in sequential circuits makes sequential ATPG very difficult. Partial scan is an effective technique to break loops by scanning a subset of flip-flops/registers. It is possible to generate designs which do not compromise resource utilization while significantly reducing partial scan overhead by considering the formation of loops in the datapath. However, previously, the influence of only two high level synthesis tasks, scheduling and assignment, on the testability of the design has been exploited.

Figure 4A:
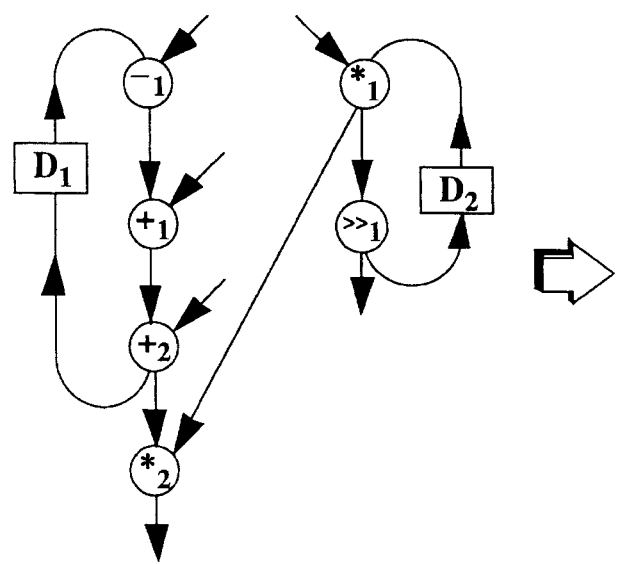
FIGS. 4(a) and 4(b) are CDFGs illustrating the use of deflection operations for reducing partial scan test costs.
Figure 4B:
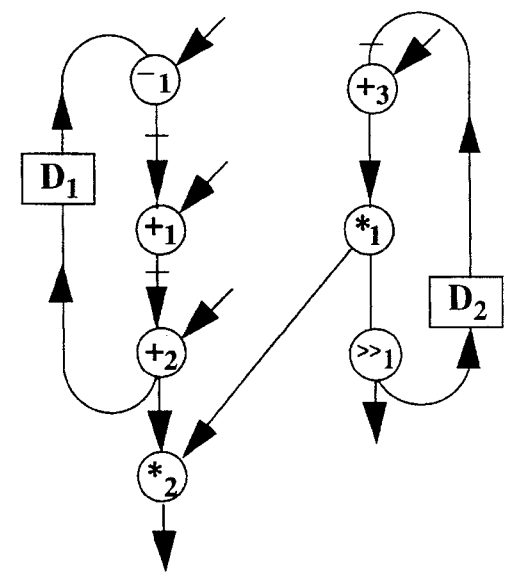
Figure 5A:
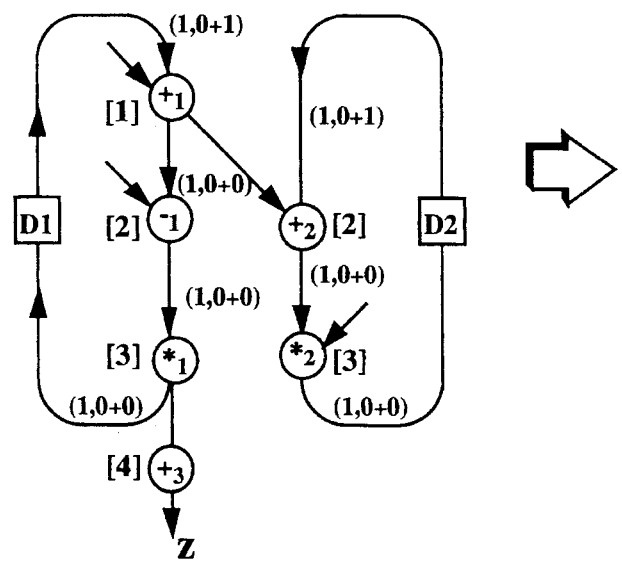
FIGS. 5(a) and 5(b) are CDFGs illustrating the use of deflection operations for reducing partial scan test overhead.
Figure 5B:
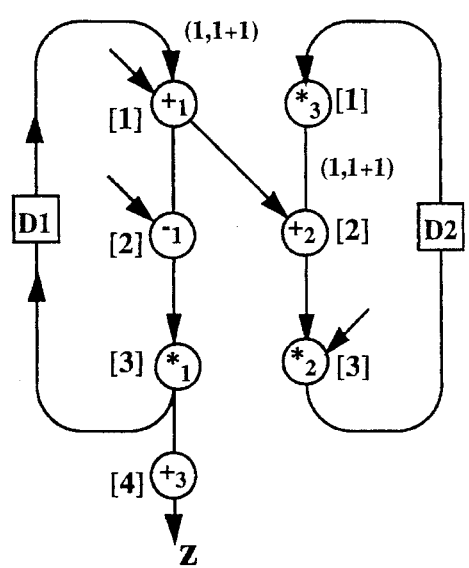

FIGS. 4(a), 5(b), 5(a) and 4(b) illustrate alternative methods for the introduction of a deflection operation which reduce partial scan overhead by preventing the formation of loops in the datapath. In the first method shown in FIGS. 4(a) and 4(b) a loop in an S-graph is broken using the register in the register file of a newly introduced deflection operation. The deflection operation is selected so that a scan register in its register file can be reused to break as many as possible loops in the datapath. The second method as shown in FIGS. 5(a) and 5(b) is characterized by the use of a deflection operation to reduce the lifetime of a variable which is stored in scan registers, so that other variables can be scanned, and the loops to which the variables belong therefore are broken.

The example shown in FIG. 4(a) has two CDFG loops which produce two loops in the datapath. Since the left loop has only addition and subtraction operations, while the right loop has only a shift and a multiplication, in the dedicated register file model it is not possible to use the same scan register for breaking both the loops. However, if a deflection operation is added as an addition with 0, as shown in FIG. 8(b), and if the scan variables are selected as indicated by the crossed edge lines, all scan variables can share the same register. The resulting datapath does not have loops. The enumeration of the required interconnects for the two implementation shows that the number of interconnects needed does not change. Consequently, resource utilization is maintained, while partial scan cost is reduced by adding deflection operations.

In the example shown in FIGS. 5(a) and 5(b) with an available time of 4 control steps, all operations are on the critical path. For each operation, the control step in which the operation is bound to be scheduled is indicated in brackets. The example has tow CDFG loops: (+1)–>(−1)–>(*1)–>(D1)–>(+1) and (+2)–>(*2)–>(D2)–>(+2). It will be apparent that the design requires at least two scan registers in order to ensure that all CDFG loops are broken, regardless of the scheduling and assignment. This is due to the fact that it is impossible to share the same scan register to break both loops. If a deflection operation *3 is added, the lifetime of variable D2 in the register file of the adder is reduced. Then the edges D1 –>+1 and *3 –>+2 can be stored in the same scan register. Therefore, the partial scan overhead is reduced.

Two distinct components of the datapath, namely interconnect and registers, can be optimized using the methods described in the present invention. There are at least two alternatives for using deflection operation in high level synthesis. The first alternative is to integrate the addition of deflection operations within scheduling (or within an integrated approach which combines allocation, scheduling, and assignment) algorithms in one compact tool. The advantage of this alternative is that as the scheduling and assignment proceeds, the structure of the CDFG can be dynamically altered so that resource allocation and time constraints are not violated.

The second alternative is to treat the introduction of deflection operations as a standard transformation and apply it before scheduling is performed. This implies a static approach to the optimization problem of reducing interconnect and registers using deflection operations. The advantages include algorithmic and software modularity, and the elimination of the need for complicated tracking associated with scheduling and assignment while defection operations are dynamically added.

It is important to preserve the advantages of both alternatives, while minimizing their negative affects. Therefore, in accordance with the teachings of the present invention, transformations are applied preferably as a fully modular step independent of scheduling and assignment. However, in order to utilize feedback information from scheduling and assignment the transformations are applied within an iterative high level synthesis framework. The causes for the difficulties of assignment and scheduling required to satisfy constraints are used to guide the addition or the removal of deflection operations in the subsequent iteration.

The initial allocation of execution units is provided by standard high level synthesis. A preferred system is the Hyper high level synthesis system which is selected because of its full software modularity and existing mechanism for the feedback information flow between different high level synthesis tasks. After each scheduling and assignment step, the process can be terminated either by the user or due to the completion of the specified number of attempts.

Most often in the field of ASIC implementation, the interconnect network is the dominant consideration. The primary goal during the introduction of deflection operations is to transform the computation so that the resource utilization of the interconnect network is improved. The goal is to eliminate as many interconnects as possible, while not reducing the likelihood for scheduling within a given resource (execution units) and timing (available time) constraints. Every time a decision is made to introduce a new deflection operation, it is necessary to decide both the place (edge) on which the operation will be introduced and the type of deflection operation to be introduced.

Preferably, deflection operations are added or deleted one at a time. Therefore, in order to avoid producing only locally optimal solutions, after each addition or deletion it is necessary to consider not only the immediate effects of the just introduced deflection operation, but also consequences on future potential introduction of other deflection operations. The situation is further complicated due to the incomplete knowledge about effects of the latter on future scheduling and assignment steps.

In order to properly address both intermediate and long term consequences the location where a deflection operation will be introduced is decided according to the following criteria which arc listed in the decreasing order of importance.

1. Edges which are not on the critical paths and which are not significantly reducing scheduling mobility of operations.
2. Edges which correspond to rarely used interconnects.
3. Edges which can be replaced by a combination of two other transfers (due to a deflection operation) so that new edges have high likelihoods of using already existing operations.
4. Transfers which are not good candidates for being used as a component of deflection operations for reducing interconnect requirements in other parts of computations.
5. Deflection operations which will result in division of long variable lifetimes.

The change in scheduling mobility is calculated as the reduction of the sum of weighted slacks of all operations. The frequency of how often an interconnect is used is calculated as the ratio of the number of instances of transfers at the behavior level divided by the product of control steps and the targeted number of interconnects at the RT level, as indicated by the scheduler. The final criteria targets the reduction of register requirements and is based on the empirical intuitive observation that variables with very long lifetimes can rarely share registers with other variables.

Once the location of introduction of a deflection operation is decided, the type of the introduced deflection operations is decided using the following three criteria:

1. Operations which reduce the mobility least. Note the operations with longer execution times reduce mobility proportionally more.
2. Operations which are not competing for the critical resources (execution units) which are bound to be scheduled in the same control cycles. The level of completion is calculated as the overall of as soon as possible-as long as possible (ASAP-ALAP) times of operations.
3. Operations whose transfers are not good candidates for elimination as indicated by the location criteria.

After each assignment and scheduling attempt, the HYPER scheduler provides as feedback information an ordered list of resources which are often in high demand low supply situation, and therefore cause scheduling and assignment difficulties. This information is used as an indication of which deflection operation to delete, and to update the preference that a deflection operation of a particular type is added.

The optimization of registers is a significantly more complex problem due to the fact that before scheduling and assignment are complete information regarding the lifetimes of the variables is not available. Therefore, it is difficult to estimate the eventual register requirements before the scheduling is completed. After scheduling and assignment of operations have been completed, assigning variables to registers within a register file is a NP-complete problem.

As previously indicated, one of the criteria used during the addition of deflection operations for reducing interconnect requirements targets reduction of registers. After the optimization of interconnects and the synthesis of datapath using scheduling and assignment have been completed, the minimization of registers using deflection operations is attempted. During this step, an additional constraint is applied that addition of new interconnects is not permitted.

Each register in the datapath is targeted for removal, in decreasing order of preference, according to the following criteria:

1. The number of variables which share the registers. The registers with one variable are targeted first, followed by registers with increasing numbers of variables;
2. The sum of the lifetimes of all currently stored variables in the register; and
3. The registers in register files which have the largest number of incoming interconnects, because the incoming interconnect has to be used during the introduction of deflection operations and it enables the transfer from the largest number of other register files.

After applying the present invention, a circuit is synthesized having a lesser number of registers, interconnects, and a smaller area occupied by the circuit when compared with present state-of-the-art design synthesis methods. This result is obtained even in the absence of any consideration of design testability.

In accordance with the teachings of the present invention, transformation methods can also be used to minimize the number of scan registers needed to break CDFG loops and to avoid the formation of other types of loops during assignment. The original computation structure (CDFG) is first transformed by adding suitable deflection operations, so that the number of scan registers needed to break CDFG loops is minimized. Subsequently, a second set of deflection operations are added so that the selected scan registers can be effectively used to avoid formation of loops during assignment. The synthesis for testability algorithm (SFT) is then applied to the transformed CDFG to synthesize a testable datapath with a minimal number of scan registers.

Figure 6A:
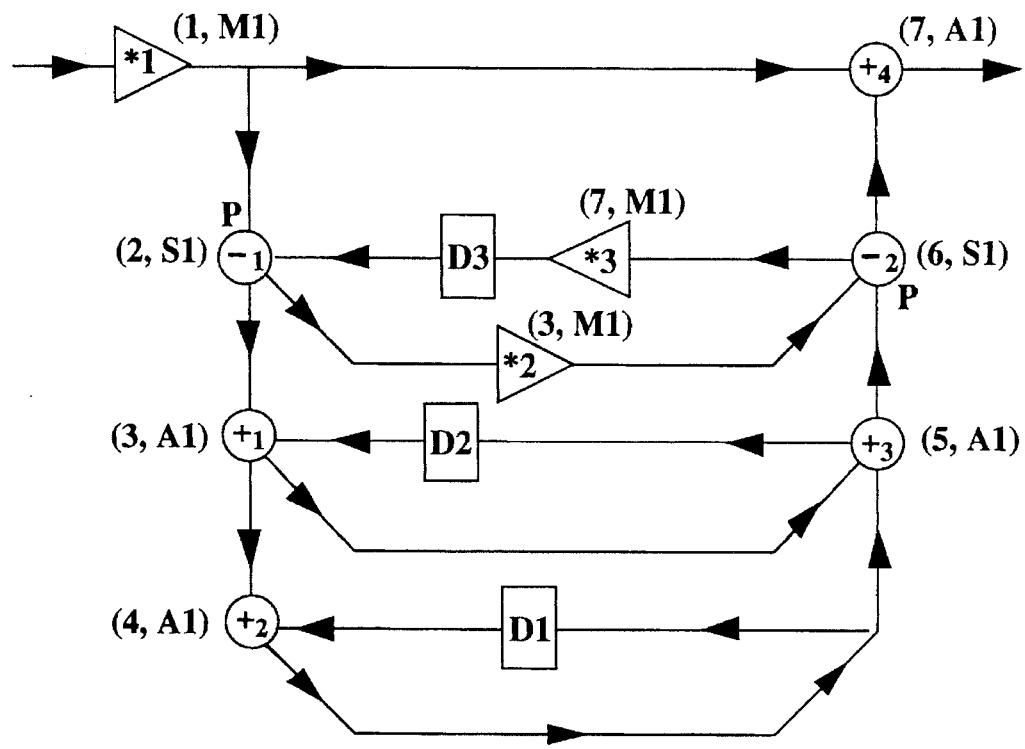
FIG. 6(a) is a CDFG of a Continued Fraction IIR filter.

In order to understand the principle of synthesis for testability, consider the CDFG of the Continued Fraction IIR filter shown in FIG. 6(a). To break the CDFG loops, the SFT approach selects the scan variables (D1,+2), (D2,+1)and (−2,*3), requiring three scan registers, since the selected scan variables cannot be shared. The CDFG loops cannot be broken using fewer scan registers. An additional scan register is needed to avoid formation of loops during assignment.

Figure 7A:
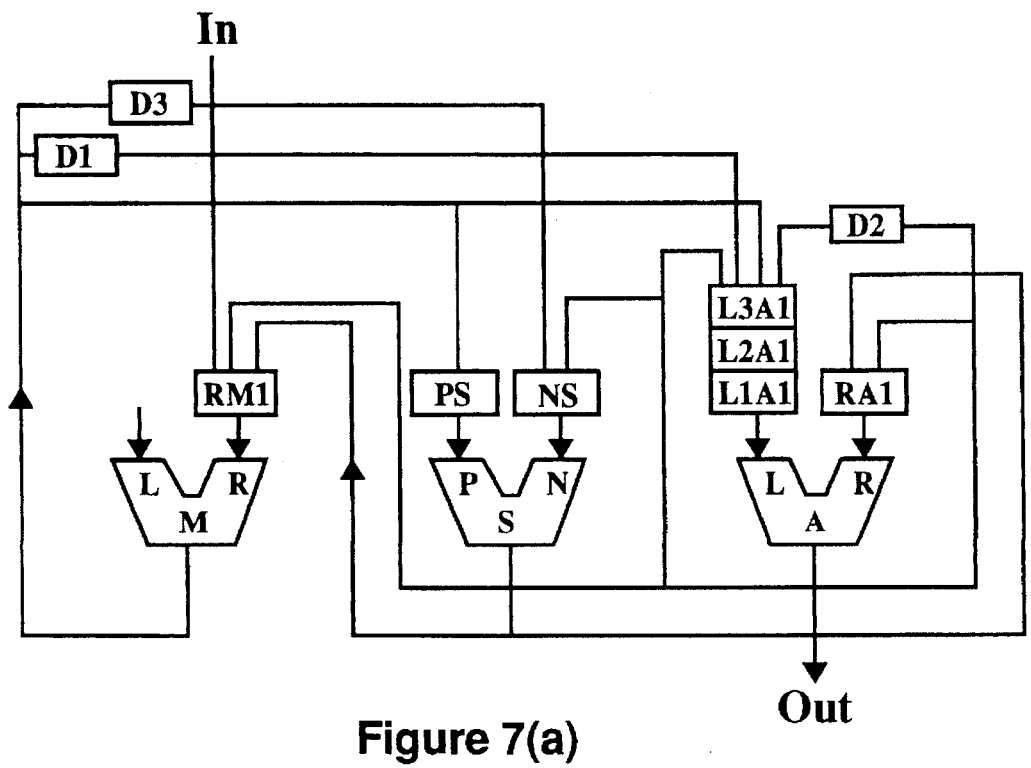
FIG. 7(a) is a representation of the datapath of the CDFG shown in FIG. 6(a)

Assume that each operation in the CDFG takes one control cycle. FIG. 6(a) shows the schedule and assignment obtained by the SFT method, satisfying the available time of 7 control steps and using the minimal number of execution units. For instance, the operation +1 is scheduled in control step 3 and is assigned to adder A1, shown by the tuple (3,A1). The resultant data path is shown in FIG. 7(a). The selected scan registers to break the CDFG loops are L3A1, L1A1, and RM1.

During the assignment phase, further loops can be introduced. For instance, in the case of the CDFG in FIG. 6(a), both the operations +3 and +4 had to be assigned to the same adder A1 thus creating an assignment loop (RA1, PS1, RA1). When the operations along a CDFG path from operation u to operation v are assigned n separate modules, and u and v are assigned the same module, an assignment loop of length n is created in the datapath. Although there is no path in the CDFG from a − operation back to a − operation through an addition operation, there is a loop (NS,RA1,NS). This loop is referred to as a sequential false loop, introduced because +1 and +1 are assigned to S1 and A1, while +3 and −2 are assigned to A1 and S1 respectively. The scan register selected by the SFT method to avoid the assignment and false loops during assignment is RA1, for a total of four scan registers. Note that scanning the four registers L3A1, L1A1, RM1 and RA1 leaves no loops, other than self-loops, in the datapath.

Figure 6B:
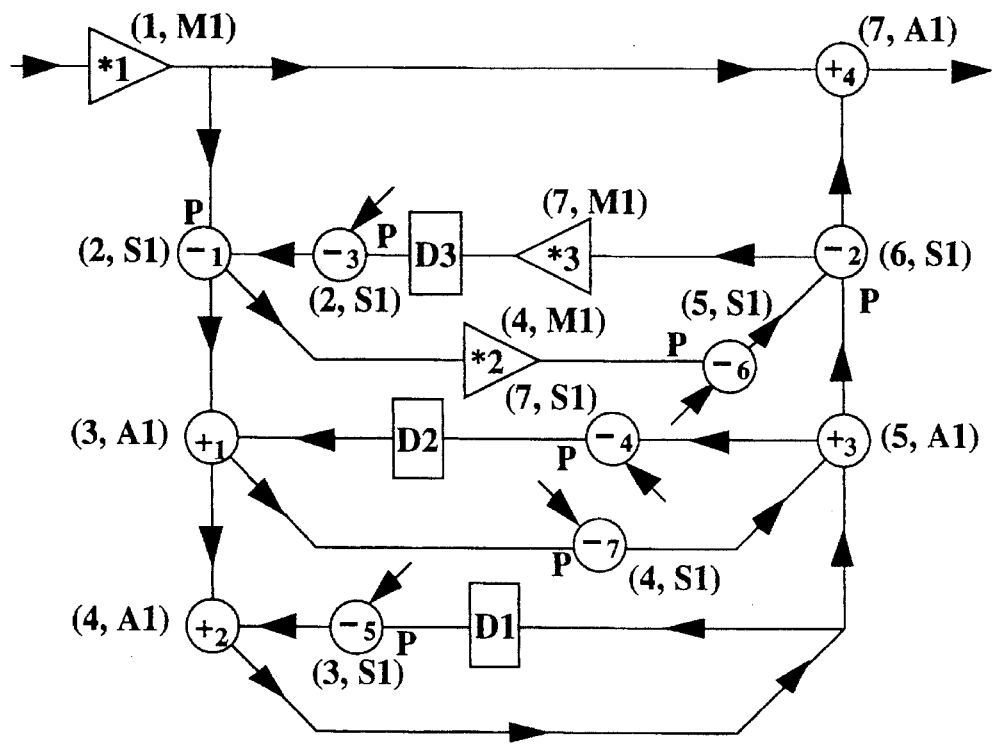
FIG. 6(b) is the CDFG of the Continued Fraction IIR filter of FIG. 6(a) after the addition of deflection operations.
Figure 7B:
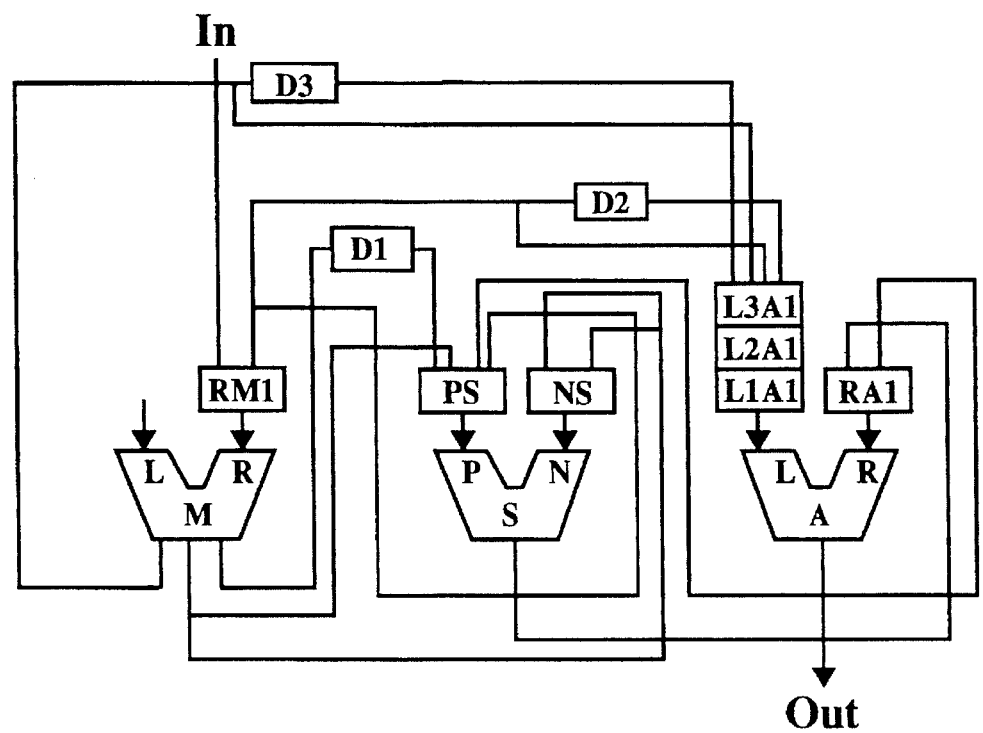
FIG. 7(b) is a representation of the datapath of the CDFG shown in FIG. 6(b)

FIG. 6(b) shows the CDFG of FIG. 6(a) with deflection operations added. The SFT method is applied to the transformed CDFG shown in FIG. 6(b). All CDFG loops can be broken by selecting the scan variables (D1,−5), (+3,−4) and (D3,−3). These scan variables can share the same scan register. Addition of deflection operations reduces the minimum number of scan registers required to break all CDFG loops from the three in the original CDFG to one in the transformed CDFG. Moreover, all assignment and false loops can be avoided by assigning the variables (*3,−1) and (+3,−2) to the partial scan register selected, PS. The datapath generated by the SFT technique is shown in FIG. 7(b). Note that if the register PS is scanned, the datapath does not have any loops. Consequently, making the datapath for the transformed CDFG with deflection operations testable is significantly more economical than the original CDFG, requiring only one scan register as opposed to the four scan registers required to make the datapath for the original CDFG testable.

The problem of breaking CDFG loops using a minimal number of scan registers is described in copending patent application serial no. 08/113,056 which is incorporated herein by reference. The minimum hardware-shared cut (HSC) problem is to select a set of scan variables such that the following criteria are simultaneously satisfied: (1) All CDFG loops, except self-loops, are broken, (2) the selected scan variables can be assigned to a minimum number of scan registers, and, (3) reusability of the scan registers, to break the other loops formed during the subsequent scheduling and assignment phase, is maximized.

Two measures can be used to capture the effectiveness of a variable in satisfying the three criteria of the minimum HSC problem. The loop cutting effectiveness (LCE) measure helps to satisfy the first criteria of the minimum HSC problem. The LCE measure of a variable estimates the number of loops that will be broken by assigning the variable to a scan register. Since the number of loops can be exponential, and there is no known algorithm to count them efficiently, a random walk based technique was proposed to calculate the LCE measure of the variables of a CDFG.

The hardware sharing effectiveness (HSE) measure satisfies criteria 2 and 3 of the minimum HSC problem. The HSE of a variable v estimates the likelihood that v can share a scan register with other variables which may be needed to break all four types of loops in the datapath.

In accordance with the teachings of the present invention, an effective HSE measure is now described. Let $f_v$ be the type of operation to which variable v is an input. Variable v can share a scan register with all variables x such that (i) x is a corresponding input to an operation of the same type $f_v$, and (ii) the lifetimes of v and x do not overlap. Let set X contain those variables x which can share a scan register with variable v. Also, let Y be a subset of X such that variables in Y can cut one or more loops not broken by scanning variable v. HSE(v) is defined as $HSE(v) = w_1|Y| + w_2|X - Y|$.

The first component reflects the number of variables that can share the same scan register assigned to v and can be used to cut CDFG loops left unbroken by v. The second component measures the likelihood that the scan register SR1, to which the variable v will be assigned, can be effectively reused later to avoid forming loops during the subsequent scheduling and assignment phase. To favor selection of scan variables good for minimizing the number of scan registers needed to break CDFG loops, as opposed to scan variables which are good to avoid formation of loops during assignment, the weight $w_1$ is set to be much higher that the weight $w_2$.

After calculating the LCE and HSE measures for each edge e which belongs to some strongly connected component (SCC), $\text{eff}_{HSC}(e)=\alpha*\text{LCE}(e)+\beta*\text{HSE}(e)$ is calculated. For each SCC, the selected scan variable is the edge e with highest $\text{eff}_{HSC}(e)$ and the selected edge is deleted from the CDFG. The process is repeated until all CDFG loops are broken. After the scan variables have been selected to cut the CDFG loops, a minimum set of scan registers is identified to which all the scan variables can be assigned. This can be optimized by assigning all scan variables with disjoint lifetimes to the same scan register.

Deflection operations can be used to minimize the number of scan registers required to break CDFG loops. This is achieved by adding the deflection operations in such a way that more selected scan variables can share the same scan register.

Two scan variables v and w cannot share the same scan register if either one or both of the following two conditions (B1 and B2), termed hardware sharing bottlenecks, is true. Note that the hardware sharing bottleneck B1 is imposed due to the hardware model adopted. B1. Variables v and w are inputs to two operations of different types. B2. Variables v and w have overlapping lifetimes.

Referring to the CDFG shown in FIG. 4(a). It has two CDFG loops: loop L1 comprising − and + operations, the other loop L2 containing operations of the types * and >>. Variables $(D_1,-_1)$ and $(D_2,*_1)$ have overlapping lifetimes (bottleneck B2), and hence selecting them to break the CDFG loops will require two scan registers. Any other variable v in loop L1 and variable w in loop L2 selected to break the corresponding loops L1 and L2 cannot be shared since they are inputs to two operations of different types (bottleneck B1). Hence, selection of any two scan variables to break the two CDFG loops will require two scan registers.

However, if the deflection operation $+_3$ is added at the input of operation $*_1$ in loop L2, as shown in the modified CDFG in FIG. 4(b), the variables $(-_1, +_1)$ in loop L1 and $(D_2,+_3)$ in loop L2, do not have either of the bottlenecks, and hence can share the same register. Consequently, selecting $(-_1,+_1)$ and $(D_2,+_3)$ as scan variables breaks the two CDFG loops, and requires only one scan register.

Note that for any variable v that can be used to break a CDFG loop in FIG. 4(a), the set Y of variables that can be used to cut other CDFG loops not broken by v and which can share the same scan register with v, is empty. The addition of the deflection operation in the CDFG as shown in FIG. 4(b) increases the value of |Y| to 1 for the variable $(-_1,+_1)$, and adds a new variable $(D_2,+_3)$ with |Y|=1. At this point, these two variables have the highest HSE measure. The LCE measure remains the same for all the variables in the loops, the variables $(-_1,+_1)$ and $(D_2,+_3)$ are selected as scan variables by the scan selection process described above, and can be assigned to one scan register. This example demonstrates how deflection operations can be used to minimize the number of scan registers required to break CDFG loops by eliminating bottleneck B1 and increasing the HSE measure of candidate scan variables.

Deflection operations can also be used to eliminate the hardware sharing bottleneck B2 where variables have overlapping lifetimes. Consider a pair of variables v and w which are inputs to the same type of operation, but which cannot share the same scan register due to bottleneck B2. That is, they are unable to have overlapping lifetimes. A deflection operation can be introduced on the edge w, so that the lifetime of variable w is split, and the variables v and the new input u to the deflection operation do not have any hardware sharing bottleneck.

Referring to the CDFG shown in FIG. 5(a), comprising two CDFG loops L1 and L2. Each pair of variables, (v,w), v in loop L1, and w in loop L2, needed to break the CDFG loops, have one hardware sharing bottleneck, and cannot be shared. For instance, one possible pair of variables that are inputs to the same type of operations is: $(D_1,+_1)$ and $(D_2,+_2)$. However, they have overlapping lifetimes. Similarly, variables $(-_1,*_1)$ and $(+_2,*_2)$ are inputs to same operation type, but have overlapping lifetimes. Any pair of scan variables selected to break the CDFG loops in FIG. 5(a) would require two scan registers.

The LCE and HSE measures of the variables are shown by a tuple (LCE,HSE), with the HSE portion showing both of the components. For example, the variable $(D_1,+_1)$ breaks one loop, and hence has an LCE value or 1. Also, $X(v)=\{*_1,+_3\},Y(v)=\{\}$. Hence, the first component of HSE measure is 0 and the second component is 1, as shown by the tuple (1,0+1) next to variable $(D_1,+_1)$.

Consider each variable in the CDFG which can break loop L2 and which is not broken by scanning variable $(D_1,+_1)$. Consider one such variable $(D_2,+_2)$. The pair of variables can break all the CDFG loops and are inputs to the same type of operation +, but cannot be shared because of the hardware sharing bottleneck B2. Therefore, the addition of a deflection operation, $*_3$, on the edge $(D_2,+_2)$ as shown in FIG. 5(b) is made such that the lifetime of the split variable $(*_3,+_2)$ no longer overlaps with the lifetime of variable $(D_1,+_1)$. The transformed CDFG is shown in FIG. 5(b). The bottleneck B2 is eliminated, and variables $(D_1,+_1)$ and $(*_3,+_2)$ can share the same scan register.

In terms of the HSC problem formulation, introduction of the deflection operation helps increase the HSE measure of variables while keeping the LCE measure unchanged. After the introduction of the deflection operation, shown in FIG. 5(b), variables $(D_1,+_1)$ and $(*_3,+_2)$ can now share the same scan register, and hence, the HSE measure of variables $(D_1,+_1)$ increases from (0+1) to (1+1). Similar, the split variable $(*_3,+_2)$ now has a HSE value (1+1). The scan selection process will select variables $(D_1,+_1)$, $(*_3,+_2)$ to break the CDFG loops, requiring only one scan register. Thus, deflection operations can be added to the CDFG to eliminate hardware sharing bottlenecks.

Having described the effects of adding deflection operations, an algorithm for the process of adding a deflection operation so that the number of scan registers required by the scan variables to break the CDFG loops not broken by v, and either (1) both v,w are inputs to the same operation type, or (2) v,w do not have overlapping lifetimes, but not both will now be disclosed. That is Z(v) is the set of all variables w which break other loops not broken by v, but cannot share the same scan register because the pair of variables (v,w) have one of the two bottlenecks, B1 or B2. The object of adding the deflection operations to the loops is to eliminate the hardware sharing bottlenecks of those pairs of variables which are potentially good candidates for scan variables. This is achieved by attempting to increase the HSE measures of those variables Z(v) which can be potentially shared, after eliminating bottlenecks, with variables v with high LCE measure (cuts many loops). The algorithm for adding deflection operations to minimize the number of scan registers needed to break CDFG loops is:

--- add_deflection_ops_to_break_CDFG_loops ()

---

1. for each variable v with positive LCE measure, but low HSE measure {
2.    for each w in Z(v) {
3.       add deflection operation op_d on w;
4.       check feasibility of adding op_d, with respect to scheduling and assignment;
5.       if deflection operation op_d feasible {
6.          for all variables, calculate nHSE(r) = new HSE(U) − hardware cost of adding $op_d$;
7.          retain the highest nHSE values for each variable;
         }
   }
}
8. select scan variables (virtual operation) assuming nHSE values;
9. for each variable v selected, add the deflection operations necessary to obtain the new HSE value, nHSE(v);

---

The formation of different types of loops in the datapath during the assignment phase can be captured by using a Data-Dependency and Compatibility Graph (DDCG). The DDCG models the data dependencies and the compatibilities of the operations of the CDFG. Each node in the graph represents an operation of the CDFG. There is a (undirected) compatibility edge between two operations if there is a non-zero probability that both of the operations can be assigned to the same. There is a (directed) data-dependency edge from operation v to operation w if operation w depends on data produced by operation v. A compatibility edge between v and w is denoted as c(v,w), and a data-dependency edge from v to w is denoted as d(v,w).

Figure 8A:
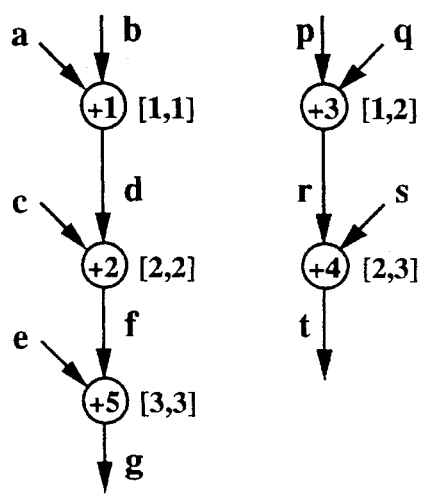
FIG. 8(a) is a representation of segments of two paths in a CDFG.
Figure 8B:
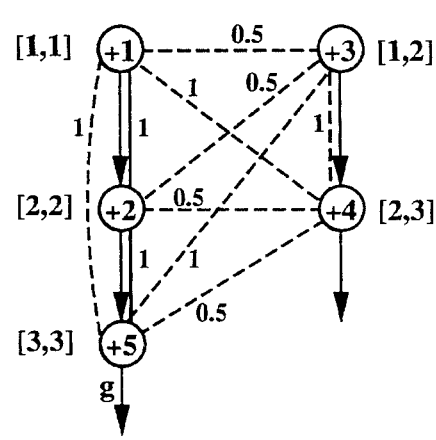
FIG. 8(b) is a representation of a DDCG of the CDFG of FIG. 8(a).

FIG. 8(a) shows segments of two paths in a CDFG, and FIG. 8(b) shows the data-dependency and compatibility graph corresponding to the CDFG in FIG. 8(a). Assuming that each operation in the CDFG takes one control cycle, the longest path is three control steps long. For a schedule which requires three control steps, the As Soon As Possible (ASAP) and the As Late As Possible (ALAP) control steps in which each operation can be scheduled is shown by the tuple [ASAP,ALAP] in FIG. 8(a). In FIG. 8(b), each compatibility edge c(v,w), shown dotted, is weighted by an estimate of the compatibility, comp(v,w), between two nodes v and w, as given by:

$Comp(v, w) =$ $$\left\{ \left( 1 - \frac{\text{overlap}(v, w)}{(\text{mobility}(v) * \text{mobility}(w))} \right)^{\exists d(v, w)} \text{otherwise} \right.$$

The paths of the DDCG can be represented using regular expressions. The symbol $d^+$ represents a path comprising a sequence of one or more data-dependency edges d. The concatenation of two paths p and q is represented by pq., or simply pq. For example, the regular expression $cd^+$ represents a path starting with a compatibility edge c, followed by one or more occurrences of data-dependency edges. In FIG. 8(b), the path $(+_5, +_1)$, $(+_1, +_2)$, $(+_2, +_5)$ can be represented by $cd^+$.

An assignment loop is formed in the datapath if there exists a cycle of the form $cd^+$ in the DDCG and the compatibility edge c is used during module assignment.

Similarly, if there is a cycle of the form $(cd_+)(cd^+)^+$ in the DDCG and the compatible edges c in the cycle are used during module assignment, a sequential false loop is formed in the datapath.

Deflection operations can also be added to avoid the formation of loops during assignment, namely assignment loops and sequential false loops. The preferred method is adding all the dummy operations required in the beginning, and performing the three phases of allocation, selecting scan variables for CDFG loops, and scheduling and assignment, on the transformed CDFG. Since the deflection operations are added before it is known which loops can be formed during assignment, the DDCG and the compatibility estimates are used to insert deflection operations. The DDCG has information about all possible loops that can be formed during assignment. Only those loops that have a high possibility of formation during assignment, as reflected by the high values of comp(v,w) on their c edges are considered. Those loops which have a low possibility of forming, due to low values of comp(v,w) on their c edges are disregarded. To achieve this, all those compatibility edges which have compatibility estimates less than a threshold are deleted.

Deflection operations are inserted in the CDFG so as to be able to break as many loops remaining in the DDCG. Every time a deflection operation is added, the corresponding data-dependency edge in the DDCG is broken in anticipation that the input of the deflection operation will be scanned. If the resultant DDCG contains no loops of the form $cd^+$ or $(cd^+)(cd^+)^+$, the result is that no loops will be formed during assignment. Otherwise, the addition of the deflection operations have minimized the chances of formation of loops during the scheduling and assignment phase. This process may be represented as follows:

--- add_deflection_ops_to_avoid_loops_during_assignment ()

---

1. create DDCG from the given CDFG;
2. remove data dependency edges from DDCG, corresponding to scan vars selected for CDFG loops;
3. delete compatibility edges having compatibility estimate comp(v,w) < threshold;
4. for every loop L of the form $cd^+$ or $(cd^+)(cd^+)^+$ in DDCG {
5.    attempt to add a deflection operation op_d on a d edge in CDFG such that loop L in DDCG is broken;
6.    check if adding op_d is feasible, in terms of scheduling, assignment and RU cost;
7.    if deflection operation op_d is feasible {
8.       add $op_d$ in CDFG;
9.       delete the d edge in DDCG;
   }
}
10. return transformed CDFG, with added deflection operations.

---

After synthesizing the circuit to include those deflection operations required to minimize the interconnects and registers while preserving throughput, the resultant circuit is fabricated in a conventional manner. The resultant fabricated circuit performs the required operational functionality while reducing overhead and costs of partial scan testing.

While there has been described and illustrated a method of high level synthesis transformation using deflection operations, it will be apparent to those skilled in the art that modifications and variations are possible without deviating from the broad principle and spirit of the present invention which shall be limited solely by the scope of the claims appended hereto.

What is claimed is:

1. A method of high level circuit design synthesis using transformations by adding deflection operations for reducing the quantity of scan registers for partial scan testing of the circuit comprising the steps of:

defining the circuit functionality in terms of a control data flow diagram (CDFG);

adding deflection operations to the control data flow diagram such that there is an absence of hardware sharing bottlenecks; and synthesizing the circuit to include said added deflection operations.

2. A method of high level circuit design synthesis using transformations by adding deflection operations as set forth in claim 1, further comprising the steps of:

determining a loop cutting effectiveness (LCE) measure of the variables of the CDFG; and determining a hardware sharing effectiveness (HSE) measure of the variables of the CDFG;

where said adding deflection operations causes an increase in the HSE and maintains the LCE constant.

3. A method of high level circuit design synthesis using transformations by adding deflection operations as set forth in claim 2, where said adding deflection operations comprises performing add_deflection_ops_to_break_CDFG_loops().

4. A method of high level circuit design synthesis using transformations by adding deflection operations as set forth in claim 1, where said adding deflection operations comprises performing add_deflection_ops_to_avoid_loops_during_assignment().

5. A method of high level circuit design synthesis using transformations by adding deflection operations for increasing resource utilization and reducing partial scan overhead comprising the steps of:

defining the circuit functionality in terms of a control data flow diagram (CDFG);

selecting scan variables for breaking loops in the control data flow diagram such that the selected variables are inputs to operation of the same type and the selected variables do not have overlapping lifetimes;

adding deflection operations in accordance with the selected scan variables; and synthesizing the circuit to include said added deflection operations.

6. A method of high level circuit design synthesis using transformations for improving resource utilization and reducing area comprising the steps of:

defining the circuit functionality in terms of a control data flow diagram (CDFG);

adding deflection operations to the control data flow diagram to reduce the number of registers and interconnects in the circuit design without changing the circuit functionality; and synthesizing the circuit including said added deflection operations.

7. A method of high level circuit design synthesis using transformations as set forth in claim 6, wherein said deflection operation is multiplication by one.

8. A method of high level circuit design synthesis using transformations as set forth in claim 6, wherein said deflection operations is addition by zero.

9. A method of high level circuit design synthesis using transformations as set forth in claim 6, wherein said deflection operation is division by one.

10. A method of high level circuit design synthesis using transformations as set forth in claim 6, wherein said deflection operations is subtraction with zero.

* * * * *